US007230459B2

(12) United States Patent
Xie

(10) Patent No.: US 7,230,459 B2
(45) Date of Patent: Jun. 12, 2007

(54) STATIC FREQUENCY DIVIDER FOR MICROWAVE APPLICATIONS

(75) Inventor: Jingqiong Xie, Kanata (CA)

(73) Assignee: STMicroelectronics, Inc., Carrollton, TX (US)

( * ) Notice: Subject to any disclaimer, the term of this patent is extended or adjusted under 35 U.S.C. 154(b) by 92 days.

(21) Appl. No.: 10/880,990

(22) Filed: Jun. 30, 2004

(65) Prior Publication Data

US 2006/0001460 A1     Jan. 5, 2006

(51) Int. Cl.
*H03B 19/00*     (2006.01)
*H03K 3/289*     (2006.01)

(52) U.S. Cl. .................. 327/117; 327/115; 327/202; 327/203

(58) Field of Classification Search ......... 327/199–218
See application file for complete search history.

(56) References Cited

U.S. PATENT DOCUMENTS

| | | | |
|---|---|---|---|
| 4,730,349 A |   | 3/1988 | Wilhelm et al. |
| 5,754,062 A | * | 5/1998 | Satoh et al. ................. 326/126 |
| 5,844,437 A | * | 12/1998 | Asazawa et al. ............. 327/202 |
| 5,900,760 A | * | 5/1999 | Lee ............................. 327/202 |
| 5,969,556 A | * | 10/1999 | Hayakawa ................... 327/202 |
| 6,218,878 B1 | * | 4/2001 | Ueno ........................... 327/202 |
| 6,268,752 B1 | * | 7/2001 | Takahashi et al. ........... 327/202 |
| 6,285,262 B1 |   | 9/2001 | Kuriyama |
| 6,593,782 B2 |   | 7/2003 | Pierschel et al. ............ 327/115 |
| 6,903,579 B2 |   | 6/2005 | Rylov et al. |

FOREIGN PATENT DOCUMENTS

JP     5-166402     *     7/1993

OTHER PUBLICATIONS

L. Masini et al., "A Low Voltage 12-GHz Silicon-Germanium Status Frequency Divider with a Selectable Division Ratio", Italy date unknown.
S. Blueler et al., "A Static Frequency Divider in InP-DHBT Technology for Process Control", Diploma Thesis, Swiss Federal Institute of Technology Zurich, Mar. 2002.
Martin Wurzer,"TP 12.6 53GHz Static Frequency Divider in a Si/SiGe Bipolar Technology," ISSCC 2000/Session 12/Frequency Synthesizers and Dividers/Paper TP 12.6, pp. 206-207, 0-7803-5853-8/00.
R. Hayami et al., "40 GHz 7.9mW low-power frequency divider IC using self-aligned selective-epitaxial-growth SiGe HBTs" IEEE Electronic Letters, vol. 38, No. 14, pp. 707-709, Jul. 4, 2002.

(Continued)

*Primary Examiner*—Timothy P. Callahan
*Assistant Examiner*—Tuan T. Lam
(74) *Attorney, Agent, or Firm*—Lisa K. Jorgenson; Andre M. Szuwalski

(57) ABSTRACT

A static frequency divider circuit includes a first and second latch that are interconnected by a series path circuit and by a feedback path circuit. Each of the latches includes a reading BALLSACKbranch and a latching branch. The series path circuit includes a push-pull current driver to speed state transitions between the latching branch of the first latch and the reading branch of the second latch. Similarly, feedback path circuit includes a push-pull current driver to speed state transitions between the latching branch of the second latch and the reading branch of the first latch.

30 Claims, 3 Drawing Sheets

OTHER PUBLICATIONS

K. Ishii, et al., "Very-High-Speed Si Bipolar Static Frequency Dividers with New T-Type Flip-Flops", IEEE Journal of Solid-State Circuits, vol. 30, No. 1, Jan. 1995, pp. 19-24, 0028-9200/95504.00.

M. Mokhtari, "100+ GHz Static Divide-By-2 Circuit in InP-DHBT Technology" IEEE 2002 GaAs Digest, pp. 291-293.

G. Ritzberger, "38 GHz Low-Power Static Frequency Divider in SiGe Bipolar Technology", IEEE 2002, vol. 4, pp. 413-416, 0-7803-7448-7/02.

M. Sokolich, "A Low-Power 72.8-GHz Static Frequency Divider in AlInAs/InGaAs HBT Technology" IEEE Journal of Solid-State Circuits, vol. 36, No. 9, Sep. 2001, pp. 1328-1334.

K. Washio et al., "67-GHz Static Frequency Divider Using 0.2-am Self-Aligned SiGe HBTs" IEEE Transactions on Microwave Theory and Techniques, vol. 49, No. 1, Jan. 2001.

K. Washio et al., Ultra-High-Speed Scaled-down Self-Aligned SEG SiGe HBTs, IEEE 2002 pp. 767-770.

J. Bock et al., "Sub 5 ps SiGe Bipolar Technology" IEDM, 0-7803-7462-2/02 pp. 763-766.

* cited by examiner

STATIC FREQUENCY DIVIDER FOR MICROWAVE APPLICATIONS

BACKGROUND OF THE INVENTION

1. Technical Field of the Invention

The present invention relates to static frequency divider circuits.

2. Description of Related Art

A static frequency divider usually refers to a frequency divider consisting of two latches connected in series with a feedback path connected between. A commonly used static frequency divider 10 circuit structure is illustrated in FIG. 1. Its configuration and operation are readily understood by those skilled in the art. The divider 10 includes a first (or master) latch 12 and a second (or slave) latch 14 that are interconnected by both a series path and a feedback path. The first and second latches 12 and 14 are implemented as current mode logic (CML) D-type latches. CML is preferred because it offers fully differential routing of signal paths.

The first latch 12 includes a reading (or track) branch 16 and a latching (or latch) branch 18 as well as a double emitter-follower circuit 30(1). Similarly, the second latch 14 includes a reading (track) branch 20 and a latching (latch) branch 22 and double emitter-follower circuit 30(2). The reading and latching branches are each formed from a pair of transistors (for example, M3/M4 and M5/M6) with common collector connected load resistors (for example, R1 and R2) and positive parallel feedback from the emitter followed circuits 30. Each of the first and second latches 12 and 14 further include a steering branch 21 coupled to both the reading and latching branches and operable responsive to clock signals to steer current through either of the reading or latching branches. The steering branch is also formed from a pair of transistors (for example, M1/M2) whose collectors are connected to the coupled emitters of the paired transistors for the reading and latching branches.

For each latch, the differential circuit inputs are provided at the base terminals of the pair of transistors for the reading branch and the differential circuit outputs are provided at the emitter terminals of a pair of transistors in each of the double emitter-follower circuits 30 connected to the latching branch. The differential clock input to each latch is provided at the base terminals of the pair of transistors for the steering branch.

The connection of the two CML D-type latches in series (differential output to input) with inverted clock signals applied to the differential clock inputs (in the steering branches 21) forms a master-slave D-type flip-flop circuit of known configuration. A ½ frequency divider is then formed from this master-slave flip-flop configuration by connecting the differential outputs of the slave flip-flop to the differential inputs of the master flip-flop.

The double emitter-follower circuits 30(1) and 30(2), each composed of transistors A, B, C and D, are provided within each latch 12 and 14 to improve the operating speed of the divider 10. More specifically, transistors A and C are connected in a cascade emitter-follower fashion as a first emitter-follower and transistors B and D are connected in a cascade emitter-follower fashion as a second emitter-follower. With respect to the differential series path, the first emitter follower circuit using transistors A and C interconnects the first and second BALLSACK latches such that the output(bar) of the first latch 12 (at the emitter of transistor C) is connected to the input of the second latch 14 while the second emitter follower circuit using transistors B and D interconnects the first and second latches such that the output of the first latch (at the emitter of transistor D) is connected to the input(bar) of the second latch. With this first and second latch 12 and 14 negative differential series path interconnection implementation, the differential feedback path must be positive. So, in the differential feedback path, the first emitter follower circuit using transistors A and C interconnects the second and first latches 14 and 12 such that the output(bar) of the second latch (at the emitter of transistor C) is connected to the input(bar) of the first latch while the second emitter follower circuit using transistors B and D interconnects the second and first latches such that the output of the second latch (at the emitter of transistor D) is connected to the input of the first latch.

While the included double emitter-follower circuits 30 assist with enhancing the operating speed of the divider 10, it is still not fast enough and stable enough to operate at some microwave speeds. As the operating frequency of the divider 10 increases, difficulties arise with respect to the operation of transistors C and D. More specifically, the issue of transistor breakdown voltage is an important concern in high speed circuits that are designed with advanced process technologies such as SiGe. With a transition frequency approaching or above 100 GHz, the base-emitter voltages for the transistors will not scale down with the desired shrinking size of those transistors. Take, for example, the transistors C and D in FIG. 1 which will see, at least, $2*V_{be}$ across their collectors and emitters. Suppose the $BV_{ceo}$ (breakdown voltage) is 1.7V for these transistors and that $V_{be}$ for these transistors is 0.85V. In this case, then $2*V_{be}$ is 1.7V. Operating these transistors at or a little bit above $BV_{ceo}$ is possible in some cases, but is not preferred for ensuring proper transistor operation over an extended period of time. Still further, in the double emitter-follower circuits used in FIG. 1, it is very difficult in that operating environment to optimize the sizes of transistors A, B, C and D to get the highest possible operation.

Accordingly, a need exists for a static frequency divider that addresses the foregoing problems, and other problems, and further which can provide for improved operation at microwave frequencies.

SUMMARY OF THE INVENTION

In accordance with one embodiment of the present invention, a static frequency divider circuit includes a first latch having a first input and first output and a second latch having a second input and second output. A first clocked push-pull circuit interconnects the first output of the first latch to the second input of the second latch, and a second clocked push-pull circuit interconnecting the second output of the second latch to the first input of the first latch.

In accordance with another embodiment of the present invention, a circuit comprises a first differential latch having a first reading branch with differential inputs and a first latching branch with differential outputs and a second differential latch having a second reading branch with differential inputs and a second latching branch with differential outputs. A first clocked differential push-pull circuit interconnects the differential outputs of the first latching branch to the differential inputs of the second reading branch, and a second clocked differential push-pull circuit interconnects the differential outputs of the second latching branch to the differential inputs of the first reading branch.

In accordance with yet another embodiment of the present invention, a static frequency divider circuit comprises a first latch including a reading branch and latching branch both coupled to a switching branch and a second latch including a reading branch and a latching branch both coupled to a switching branch. A series path connection circuit is provided between the latching branch of the first latch and the reading branch of the second latch, wherein the series path connection circuit includes a clocked push-pull current driver to speed state transitions between the latching branch of the first latch and the reading branch of the second latch. A feedback path connection circuit is provided between the latching branch of the second latch and the reading branch of the first latch, wherein the feedback path connection circuit includes a clocked push-pull current driver to speed state transitions between the latching branch of the second latch and the reading branch of the first latch.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 2:
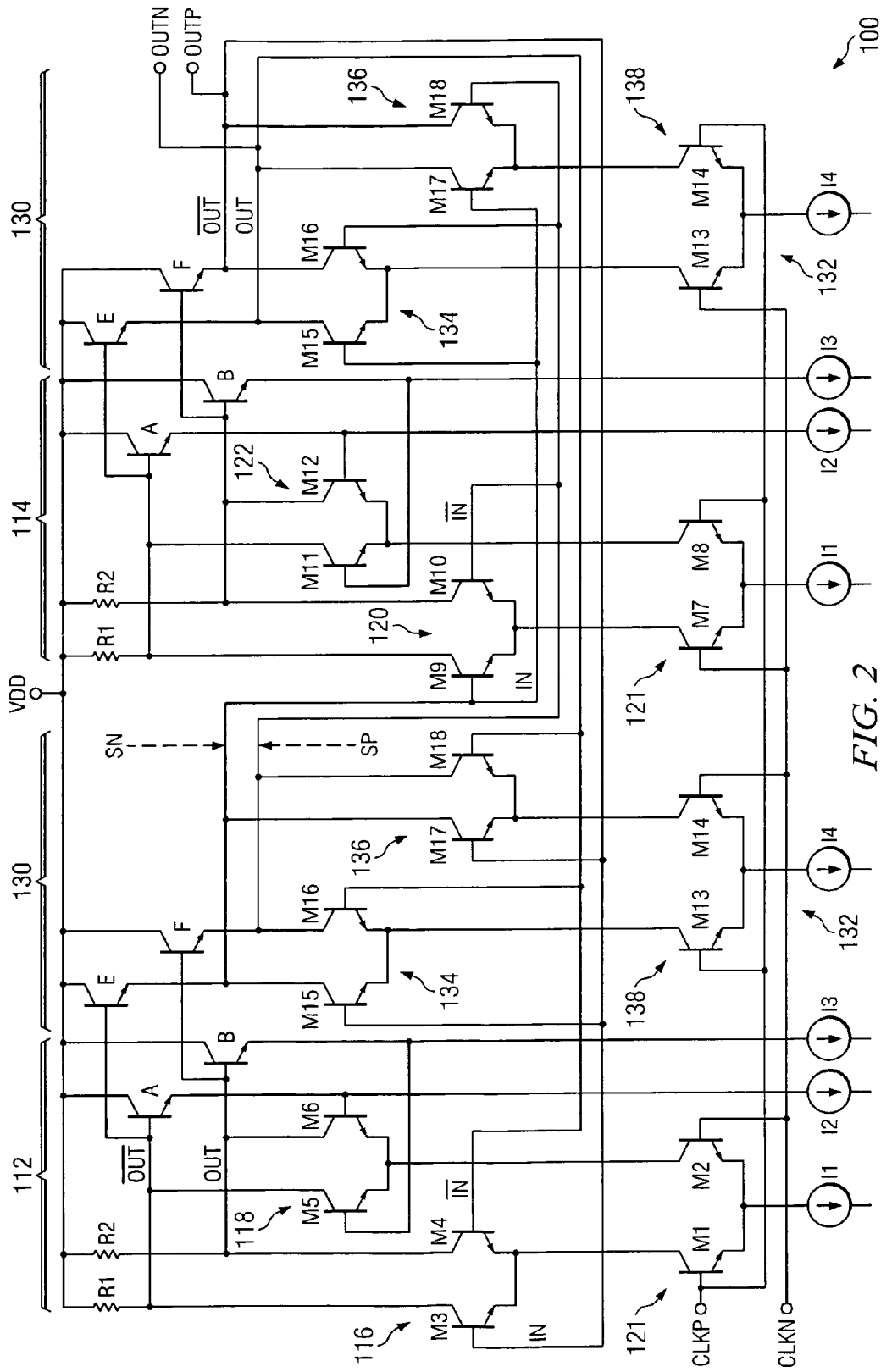
FIG. 2 is a schematic diagram of a static frequency divider in accordance with an embodiment of the present invention.

Reference is now made to FIG. 2 wherein there is shown a schematic diagram of an embodiment of a static frequency divider 100 in accordance with the present invention. The divider 100 includes a first (or master) latch 112 and a second (or slave) latch 114 that are interconnected by both a series path (from master to slave) and a feedback path (from slave to master). The first and second latches 112 and 114 are implemented as current mode logic (CML) D-type latches. CML is preferred because it offers fully differential routing of signal paths.

The first latch 112 includes a reading (or track) branch 116, a latching (or latch) branch 118 and emitter-followers composed of transistors A/B. Similarly, the second latch 114 includes a reading (track) branch 120, a latching (latch) branch 122 and emitter-followers composed of transistors A/B. The reading and latching branches are each formed from a pair of transistors (for example, M3/M4 and M5/M6) with common collector connected load resistors (for example, R1 and R2) and positive parallel feedback from the emitter-followers A/B. Each of the first and second latches 112 and 114 further include a steering branch 121 coupled to both the reading and latching branches and operable responsive to clock signals to steer current through either of the reading or latching branches. The steering branch is also formed from a pair of transistors (for example, M1/M2) whose collectors are connected to the coupled emitters of the paired transistors for each of the reading and latching branches.

For each latch, the differential circuit inputs (input and input(bar)) are provided at the base terminals of the pair of transistors for the reading branch (M3/M4 and M9/M10) and the differential circuit outputs are provided at the collector terminals of the transistors for the latching branch (M5/M6 and M11/M12). The differential clock input to each latch is provided at the base terminals of the pair of transistors for the steering branch (M1/M2 and M7/M8).

The interconnection of the two CML D-type latches in a series path (differential output to input) with inverted clock signals applied to the differential clock inputs (in the steering branches 121) forms a master-slave D-type flip-flop circuit of known configuration. A ½ frequency divider is then formed from this master-slave flip-flop configuration by connecting the differential outputs of the slave flip-flop to the differential inputs of the master flip-flop through the feedback path.

Figure 1:
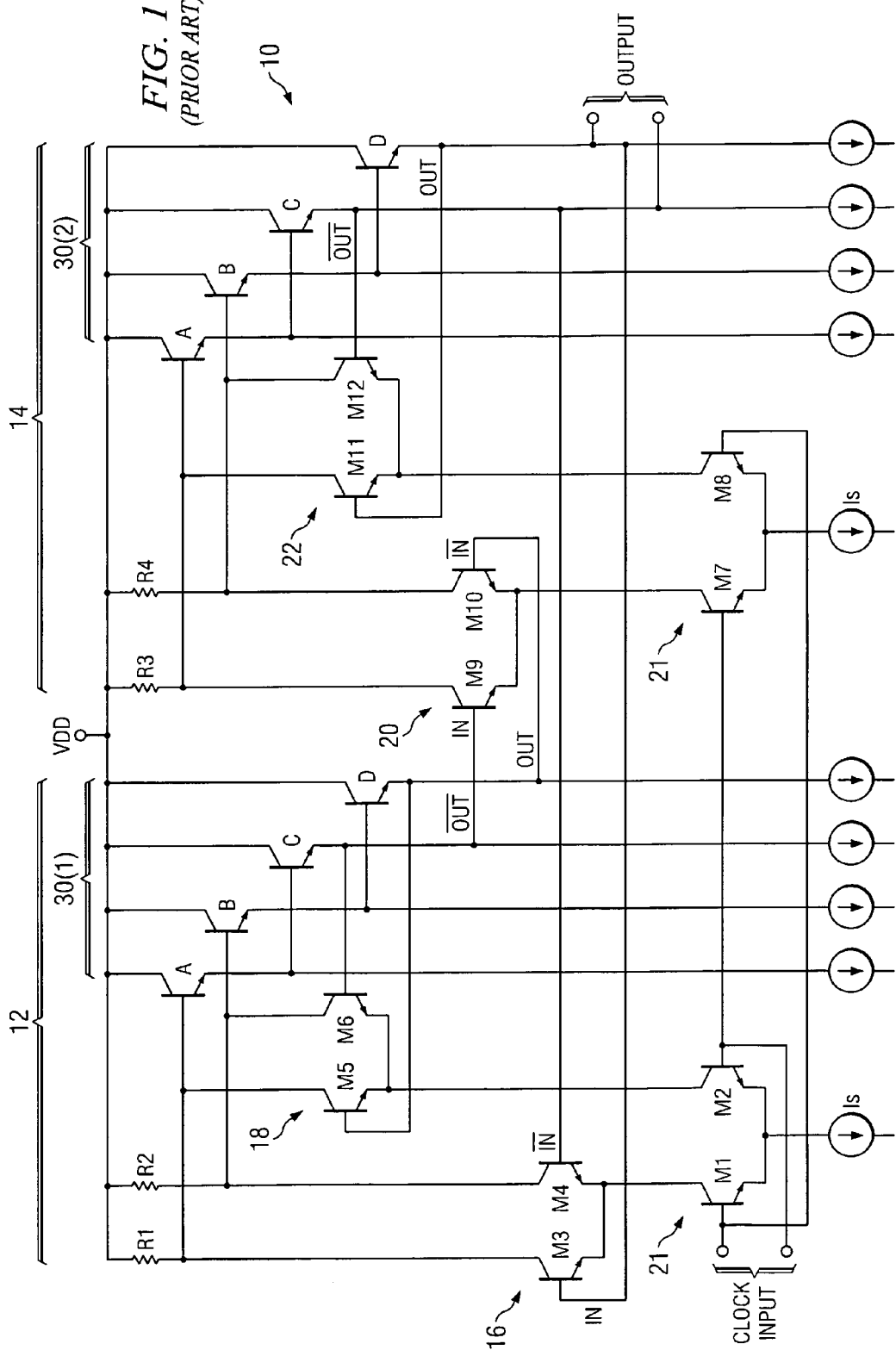
FIG. 1 is a schematic diagram of a prior art static frequency divider utilizing double emitter-follower interconnection circuits.

As discussed above with respect to FIG. 1, prior art efforts made to improve operating speed of the divider 10 implemented a double emitter-follower circuit 30 composed of transistors A, B, C and D in the first and second latched 12 and 14. With respect to the embodiment of the divider 100, the transistors A and B may, if desired, be retained and are connected within divider 100 in a manner similar to that presented in FIG. 1. However, instead of implementing a double emitter-follower circuit 30, the embodiment of the present invention shown in FIG. 2 utilizes a clocked differential push-pull driver circuit 130 to interconnect the latches. The clocked differential push-pull driver circuit 130 includes a clocked current sinking circuit 132 that is connected in an emitter-follower configuration to a pair of transistors E and F. The transistors E and F have parallel base and collector connections to the transistors A and B, respectively. The clocked current sinking circuit 132 includes a first branch 134 (comprised of transistors M15 and M16) and a second branch 136 (comprised of transistors M17 and M18), each having emitter-follower connections to the transistors E and F. The clocked current sinking circuit 132 further includes a switching (or current steering) branch 138 (comprised of transistors M13 and M14) to receive the clock signal.

The transistors A and B are illustrated as part of the circuit 112, although it will be understood that these transistors could be omitted from the circuit 112, and the divider 100, if desired. In such an implementation, the transistors would simply be replaced by short circuit connections between the collector of M5 and the base of M6 and between the collector of M6 and the base of M5. Similar short circuit connections could also be provided in the second latch with respect to the transistors M11 and M12.

The first and second branches 134 and 136 are each formed from a pair of transistors (M15/M16 and M17/M18) with common collector connections to the emitters of transistors E and F. The transistors M15 and M17 (M18 and M18) are connected in parallel at their bases and collectors. The connected bases of M15/M17 and M16/M18 are connected in parallel to the inputs of the associated latch. The bases of transistors E/F are connected in parallel to the outputs of the associated latch in such a manner that clocked push-pull operation can be generated through the circuit 130 at the emitters of transistors E and F. The switching branch 138 is coupled to both the first and second branches 134 and 136 and is operable responsive to clock signals (of the same phase as the steering branch 121 for the latch which is associated with the clocked differential push-pull circuit 130) to steer current through either of the first or second branches so as to control and direct the push and/or pull operation being exercised on the inputs of the following latch (either in series or feedback). The switching branch 138 is also formed from a pair of transistors (M13/M14) whose collectors are connected to the coupled emitters of the paired transistors for the first and second branches 134 and 136. The gates of these transistors M13/M14 received clock signals in the same phase as are received by either transistors M1/M2 or transistors M7/M8 depending on whether the circuit 130 is in the series path or feedback path, respectively.

The emitter of transistor E is connected to the collector of transistors M15 and M17 (in the first and second branches 134 and 136, respectively). The emitter of transistor F is connected to the collector of transistors M16 and M18 (in the first and second branches 134 and 136, respectively). Turning now specifically to the series interconnection between the first and second latches 112 and 114, the clocked differential push-pull circuit 130 provides the negative differential series path interconnection. The first latch 112 output(bar) is connected through the emitter of transistor E to the input of the second latch 114 at the base of transistor M9, thus providing one-half of the negative differential series interconnection between the first and second latches. The other half of the negative differential series path interconnection is provided through the connection of the first latch output through the emitter of transistor F to the input(bar) of the second latch 114 at the base of transistor M10. Conversely, with respect to the feedback interconnection between the second and first latches 114 and 112, the clocked differential push-pull circuit 130 provides the positive differential feedback path interconnection. The output (bar) of the second latch 114 is connected through the emitter of transistor E to the input (bar) of the first latch 112 at the base of transistor M4, thus providing one-half of the positive differential feedback path interconnection between the second and first latches. The other half of the positive differential feedback path interconnection is provided through the connection of the second latch 114 output through the emitter of transistor F to the input of the first latch 112 at the base of transistor M3.

It will be understood by those skilled in the art that in one divider implementation, as illustrated in FIG. 2, the output (bar) of the first latch is connected (through a first clocked differential push-pull circuit) to the input of the second latch while the output of the first latch is connected (again through the first clocked differential push-pull circuit) to the input (bar) of the second latch. With this first and second latch negative differential series path connection implementation, the differential feedback path is positive with the output(bar) of the second latch connected (through a second clocked differential push-pull circuit) to the input(bar) of the first latch and the output of the second latch connected (through the second clocked differential push-pull circuit) to the input of the first latch. In an alternative divider implementation, the first clocked differential push-pull driver circuit connects the output(bar) of the first latch to the input(bar) of the second latch and the output of the first latch to the input of the second latch. With this first and second latch positive differential series path connection implementation, the differential feedback path is negative with the second clocked differential push-pull driver circuit connecting the output (bar) of the second latch to the input of the first latch and the output of the second latch to the input(bar) of the first latch.

The static frequency divider 100 is preferably implemented as an integrated circuit device on a monolithic substrate.

The static frequency divider 100 is illustrated as utilizing bipolar transistors. It will, of course, be understood by those skilled in the art that the circuit could alternatively be implemented with MOS or CMOS FET devices if desired. In such an implementation, for example, the collector/emitter conduction terminals of the bipolar devices would correspond to drain/source conduction terminals in the FET devices and the base control terminal of the bipolar device would correspond to the gate control terminal in the FET.

Although the circuit of FIG. 2 is illustrated operating with the use of positive voltages, it will be understood that the circuit design illustrated, with appropriate modifications as recognized by one skilled in the art, could instead be configured for operation with negative voltages.

As illustrated in FIG. 2, the circuit provides for a ½ frequency division operation. Other division ratios are supported with the use of the divider 100 of FIG. 2. For example, by cascading two dividers 100 in series, as is understood by those skilled in the art, a ¼ divider may be implemented. Similar cascade connections can be made to fabricate a 1/n divider provided the designer addresses frequency versus power sensitivity issues to ensure that each included divider 100 operates within its permitted frequency range with each successive division operation.

Figure 3:
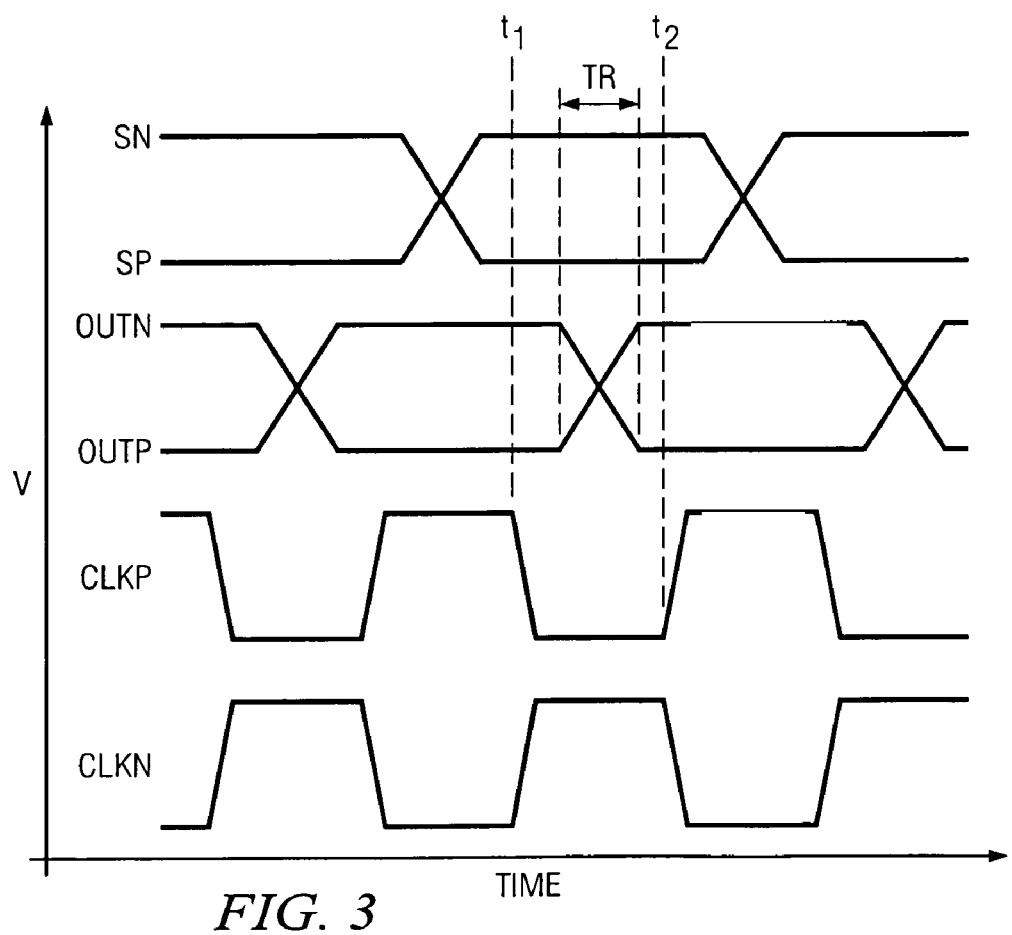
FIG. 3 is a timing diagram illustrating operation of the static frequency divider of FIG. 2.

An understanding as to how the divider 100 operates, and more particularly how the included clocked differential push-pull driver circuits 130 assist in improving the operational speed of the divider, may be obtained by reference to FIG. 3 which provides a timing diagram illustrating operation of the static frequency divider of FIG. 2. Prior to the time instant t1, the signals CLKP, OUTP and SP are all in their high states and the signals CLKN, OUTN and SN are all in their low states. The transistors M13, M15 and F within the clocked differential push-pull driver circuit 130 in the series path are accordingly turned on, while the transistors M14, M16 and E are turned off. The transistors E, F, M15 and M16, with their connections (SN and SP) through to the base terminals of transistors M9 and M10 in the second latch 114 function as a push-pull driver and provide much stronger charging and discharging currents for application to the second latch than is possible through the double emitter-follower circuits used in FIG. 1. Thus, the signals SN and SP will transition between states much more quickly than with the prior art circuit. After time instant t1, and more particularly within the time interval TR, the clock inputs change state and the transistors M13 and M14 in the switching branch of the clocked differential push-pull driver circuit 130 in the series path exchange currents as one (M14) turns on and the other (M13) turns off. While this exchange occurs, the states of the signals OUTP and OUTN continue to help transistors E, F, M15, M16, M17 and M18 to drive the differential inputs to the second latch 114 until the state transitions of OUTP and OUTN are completed. In this way, the second latch 114 receives an extra push-pull driving from transistors M17 and M18. These combined efforts in generating charging and discharging currents serve to reduce the length of time it takes for a complete transition of the OUTP and OUTN signals to be completed (i.e., the time interval TR is reduced in comparison to the prior art circuit of FIG. 1). Following the time interval TR and before the time instant t2, the output signals OUTP and OUTN have completed their state transitions and their new states help the transistors E, F, M17 and M18 maintain the states of signal SP and SN. After time instant t2, the clock inputs change state and the push-pull driving process repeats itself except that the reduced time intervals occurs with respect to the transition of the SP and SN signals while the new states help the appropriate circuit transistors to maintain the states of the OUTP and OUTN signals. Thereafter, a new cycle of the process begins and the overall process is cyclically repeated to generate the divided output signal from the input clock signal.

The terms "interconnected", "connected" or "coupled", or the like, as used herein do not necessarily require a direct connection among and between the recited components. Rather, it will be appreciated by those skilled in the art that the Figures are illustrative and indirect connections or couplings through other components or devices is possible without detracting from the operation of the invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A static frequency divider circuit, comprising:
   a first latch having a first input and first output;
   a second latch having a second input and second output;
   a first push-pull circuit interconnecting the first output of the first latch to the second input of the second latch with one of a negative/positive series path; and
   a second push-pull circuit interconnecting the second output of the second latch to the first input of the first latch with the other of the negative/positive series path,
   wherein each of the first and second latches include a clock input, the clock input of the first latch receiving a clock signal and the clock input of the second latch receiving the clock signal out of phase by 180 degrees, and wherein each of the first and second push-pull circuits include a clock input, the clock input of the first push-pull circuit receiving the clock signal and the clock input of the second push-pull circuit receiving the clock signal out of phase by 180 degrees.

2. The circuit of claim 1 wherein each of the first and second latches and each of the first and second push-pull circuits are fully differential circuits.

3. The circuit of claim 1 wherein each of the first and second push-pull circuits comprises:
   a switched emitter-follower circuit having an input connected to a latch output and an output connected to a latch input.

4. The circuit of claim 1 wherein the clock signal is a fully differential signal.

5. The circuit of claim 1 wherein the first push-pull circuit is further connected to the first input of the first latch and where the second push-pull circuit is further connected to the second input of the second latch.

6. A static frequency divider circuit, comprising:
   a first latch having a first input and first output;
   a second latch having a second input and second output;
   a first push-pull circuit interconnecting the first output of the first latch to the second input of the second latch; and
   a second push-pull circuit interconnecting the second output of the second latch to the first input of the first latch;
   wherein each of the first and second push-pull circuits comprises a switched emitter-follower circuit having an input connected to a latch output and an output connected to a latch input; and
   wherein each switched-emitter-follower circuit comprises at least one transistor having a base terminal connected to a latch output and an emitter terminal connected to a clock switched current path and to a latch input.

7. The circuit of claim 6 wherein each of the first and second latches include a clock input, the clock input of the first latch receiving a clock signal and the clock input of the second latch receiving the clock signal out of phase by 180 degrees.

8. The circuit of claim 7 wherein the clock signal is a fully differential signal.

9. The circuit of claim 6 wherein the first push-pull circuit interconnects the first latch to the second latch with a negative series path and the second push-pull circuit interconnects the second latch to the first latch with a positive feedback path.

10. A static frequency divider circuit, comprising:
    a first latch having a first input and first output;
    a second latch having a second input and second output;
    a first push-pull circuit interconnecting the first output of the first latch to the second input of the second latch with one of a negative/positive series path; and
    a second push-pull circuit interconnecting the second output of the second latch to the first input of the first latch with the other of the negative/positive series path;
    wherein each push-pull circuit comprises:
       a first transistor having its base connected to a first differential latch output and having an emitter connected to a first differential latch input;
       a second transistor having its base connected to a second differential latch output and having an emitter connected to a second differential latch input;
       a first clock switched current path connected to the emitter of the first transistor; and
       a second clock switched current path connected to the emitter of the second transistor.

11. A static frequency divider circuit, comprising:
    a first latch having a first input and first output;
    a second latch having a second input and second output;
    a first push-pull circuit interconnecting the first output of the first latch to the second input of the second latch; and
    a second push-pull circuit interconnecting the second output of the second latch to the first input of the first latch;
    wherein each push-pull circuit comprises:
       a first clock switched current sinking path connected between a first output of one latch and a first input of another latch; and
       a second clock switched current sinking path connected between a second output of the one latch and a second input of the other latch.

12. The circuit of claim 11 wherein first clock switched current sinking path is controlled by a first clock signal and the second clock switched current sinking path is controlled by a second clock signal, the first and second clock signals being out of phase by 180 degrees.

13. A circuit, comprising:
    a first differential latch having a first reading branch with differential inputs and a first latching branch with differential outputs;
    a second differential latch having a second reading branch with differential inputs and a second latching branch with differential outputs;
    a first differential push-pull circuit interconnecting the differential outputs of the first latching branch to the differential inputs of the second reading branch; and
    a second differential push-pull circuit interconnecting the differential outputs of the second latching branch to the differential inputs of the first reading branch;
    wherein each of the first and second differential push-pull circuits further comprises:
       a first clock switched current path; and
       a second clock switched current path.

14. The circuit of claim 13 further including a first and second pair of transistors, with each transistor in the first and second pair having an emitter-follower connection, the first pair of transistors connected to the differential outputs of the first latching branch and the second pair of transistors connected to the differential outputs of the second latching branch.

15. The circuit of claim 14 wherein the first pair of transistors is a part of the first differential push-pull circuit and the second pair of transistors is a part of the second differential push-pull circuit.

16. The circuit of claim 15 wherein:
the first clock switched current path is connected to an emitter of one transistor in the pair; and
the second clock switched current path is connected to an emitter of another transistor in the pair.

17. The circuit of claim 13 wherein each of the first and second differential push-pull circuits comprises:
a differential switched emitter-follower circuit having a differential input connected to a differential latch output and an output connected to a differential latch input.

18. The circuit of claim 13 wherein the first differential push-pull circuit interconnects the first differential latch to the second differential latch with a negative differential series path and the second differential push-pull circuit interconnects the second differential latch to the first differential latch with a positive differential feedback path.

19. The circuit of claim 13 wherein each of the first and second differential latches include a differential clock input, the differential clock input of the first differential latch receiving a clock signal and the differential clock input of the second differential latch receiving the clock signal out of phase by 180 degrees.

20. The circuit of claim 13 wherein the first and second differential latches are current mode logic circuits.

21. A circuit, comprising:
a first differential latch having a first reading branch with differential inputs and a first latching branch with differential outputs;
a second differential latch having a second reading branch with differential inputs and a second latching branch with differential outputs;
a first differential push-pull circuit interconnecting the differential outputs of the first latching branch to the differential inputs of the second reading branch; and
a second differential push-pull circuit interconnecting the differential outputs of the second latching branch to the differential inputs of the first reading branch;
wherein:
the first differential push-pull circuit comprises a first clock switched differential current sinking path connected between the first differential latch and the second differential latch; and
the second differential push-pull circuit comprises a second clock switched differential current sinking path connected between the second differential latch and the first differential latch.

22. A static frequency divider circuit, comprising:
a first latch including a reading branch and latching branch both coupled to a switching branch;
a second latch including a reading branch and a latching branch both coupled to a switching branch;
a series path connection circuit between the latching branch of the first latch and the reading branch of the second latch, the series path connection circuit including a push-pull current driver to speed state transitions between the latching branch of the first latch and the reading branch of the second latch; and
a feedback path connection circuit between the latching branch of the second latch and the reading branch of the first latch, the feedback path connection circuit including a push-pull current driver to speed state transitions between the latching branch of the second latch and the reading branch of the first latch;
wherein each push-pull driver comprises:
a first clock switched current sinking path connected between a first latching branch output of one latch and a first reading branch input of another latch; and
a second clock switched current sinking path connected between a second latching branch output of the one latch and a second reading branch input of the other latch.

23. The circuit of claim 22 wherein the series path connection circuit provides a positive connection between the latching branch of the second latch and the reading branch of the first latch and the feedback path connection circuit provides a negative connection between the latching branch of the second latch and the reading branch of the first latch.

24. The circuit of claim 22 wherein each of the series path connection circuit and the feedback path connection circuit comprise a switched emitter-follower circuit having an input connected to a latching branch output and an output connected to a reading branch input.

25. The circuit of claim 24 wherein the switched emitter follower circuit includes a first current path for push/pull current control over reading branch input and a second current path for pull/push current control over the reading branch input.

26. The circuit of claim 24 wherein the switched emitter follower circuit includes at least one controlled current path for pushing/pulling current to/from the reading branch input.

27. The circuit of claim 22 wherein each of the first latch, second latch, series path connection circuit and feedback path connection circuit are fully differential circuits.

28. The circuit of claim 22 wherein each of the first and second latches include a clock input, the clock input of the first latch receiving a clock signal and the clock input of the second latch receiving the clock signal out of phase by 180 degrees.

29. The circuit of claim 28 wherein the clock signal is a fully differential signal.

30. A static frequency divider circuit, comprising:
a first latch including a reading branch and latching branch both coupled to a switching branch;
a second latch including a reading branch and a latching branch both coupled to a switching branch;
a series path connection circuit between the latching branch of the first latch and the reading branch of the second latch, the series path connection circuit including a push-pull current driver to speed state transitions between the latching branch of the first latch and the reading branch of the second latch; and
a feedback path connection circuit between the latching branch of the second latch and the reading branch of the first latch, the feedback path connection circuit including a push-pull current driver to speed state transitions between the latching branch of the second latch and the reading branch of the first latch;
wherein each of the series path connection circuit and feedback path connection circuit comprises: at least one transistor having a base terminal connected to a latch output and an emitter terminal connected to a clock switched current path and to a latch input.

* * * * *

UNITED STATES PATENT AND TRADEMARK OFFICE
CERTIFICATE OF CORRECTION

| | |
|---|---|
| PATENT NO. | : 7,230,459 B2 |
| APPLICATION NO. | : 10/880990 |
| DATED | : June 12, 2007 |
| INVENTOR(S) | : Jingqiong Xie |

Page 1 of 1

It is certified that error appears in the above-identified patent and that said Letters Patent is hereby corrected as shown below:

In the Specification:

On the cover page, section (57) ABSTRACT, 4$^{th}$ line, please delete the word "BALLSACKbranch" and replace with the word -- branch --.

At column 1, line number 63, please delete the word "BALLSACK".

Signed and Sealed this
Thirteenth Day of September, 2011

David J. Kappos
*Director of the United States Patent and Trademark Office*